Jan. 18, 1966 R. C. ROOT ETAL 3,229,757

HEAT DISSIPATOR APPARATUS FOR A TRANSISTOR

Filed Dec. 16, 1963

INVENTORS
RAYMOND C. ROOT
MARVIN D. WERKMEISTER
BY George R Nimmer
ATTORNEYS

United States Patent Office 3,229,757

Patented Jan. 18, 1966

3,229,757

HEAT DISSIPATOR APPARATUS FOR A TRANSISTOR

Raymond C. Root and Marvin D. Werkmeister, Columbus, Nebr., assignors to Richleu Corporation, Columbus, Nebr., a corporation of Nebraska Filed Dec. 16, 1963, Ser. No. 330,968
1 Claim. (Cl. 165—80)

This invention relates to heat dissipator apparatuses for heat-generating electronic components and in particular to a novel unitary dual-phase support member for mounting thereagainst the heat-generating electronic component.

Among the various types of electronic components incorporated into electrical circuit assemblies are those classified broadly as heat-generators e.g. resistors, transformers, and semi-conductor devices; a few within the last-named class are transistors, diodes, and controlled rectifiers. So as not to impair the proper function thereof, excessive heating of these heat-generating electronic components must be prevented; this necessitates dissipation of the attendant generated heat from the electronic component to the ambient surroundings of the electrical assembly. This cooling requirement is particularly necessary for semi-conductor devices, and especially so with the recent advent of high power transistors. Germanium transistor junctions, for example, are commonly rated for a maximum operating temperature of 90 degrees centrigrade. When a transistor is operated at excessive junction temperatures, it is possible for regenerative heating to occur which will result in thermal runaway and possible destruction of the transistor. It is a generally accepted fact in the industry that semi-conductor failure rate is reduced 5% for each degree centigrade reduction in transistor junction operating temperature below the rated maximum.

Excessive operating temperatures in heat-generating elecronic components are commonly prevented by mounting the electronic component onto a heat dissipator apparatus, also synonymously referred to as a heat sink apparatus. These heat dissipator apparatuses commonly comprise one or more banks of a plurality of thin heat dissipator ribs, each bank being spaced along a heat-conductive web member. An elongate support member, against which the electronic component is mounted, is in heat-conductive relationship with the web member. The heat sink apparatus must possess a sufficiently low composite thermal resistance (popularly expressed in terms of degrees centigrade per watt) in order that generated heat will be dissipated from the operating electronic component to the ambient surroundings with sufficient rapidity. For this reason, most commonly utilized heat sinks possess, as the support member for the electronic component, a uniphase elongate bar i.e. an elongate bar the structural material of which is in uni-phase relationship with the web member.

Those in the electronics industry realize that a significant contribution to the thermal resistance (and conversely an impediment to thermal conductivity) between the electronic component and the ambient surroundings resides between the electronic component and the web member, specifically within that region designated as the support member. As previously stated, support members, onto which the electronic component is mounted, are generally in the form of a uni-phase heat-conductive elongate bar. For maximum thermal conductivity, the interfacial discontinuity between the support member mounting surface and the electronic component attached thereto should be of maximum snugness, closeness, and regularity i.e. of maximum conformity per unit area of mounting surface. However, the support member mounting surface of certain popularly utilized heat sinks are not readily amenable to smooth regular interfacial conformity. For example, the unitary natural-convection type heat sinks, commonly extruded from aluminum or other heat-conductive metal, because of their very extruded nature, possess comparatively rough and uneven surfaced support members. Moreover, size limitations of the support member and its relative inaccessibility between two banks of heat dissipator ribs, make it difficult and commercially impractical to prepare a smooth mounting surface. In addition, the support member is commonly provided with a plurality of punched mounting holes; the punching operation distorts the structural material about each perforation thus creating a further impediment to interfacial conformity at the support member mounting surface. Because of these inherent disadvantages in extruded and punched metallic support members, the use of a soft, flowable amorphous filler e.g. silicone oil or grease, is recommended for use at the mounting surface to enhance conformity; when this practice is followed with extruded and punched anodized aluminum heat sinks, the interfacial thermal resistance is reduced from a normal 0.4 degree centigrade/watt value down to the 0.15 to 0.30 degree centigrade/watt range.

In certain electrical assemblies it is deemed essential to electrically insulate the heat sink apparatus from the electronic component mounted thereon e.g. the power transistor case from an electrically-conductive metallic heat sink. For this purpose a hard solid electrically-insulative material, e.g. a mica washer, is commonly inserted as a pedestal-like mounting surface for the electronic component. Thus, the heat sink support member comprises an electrically conductive elongate bar and a separable hard solid electrically-insulative pedestal attached thereto by means of assorted mounting hardware; often times the amorphous oil or grease filler is used to enhance conformity between the pedestal and the elongate bar. Such a support member is of separable dual-phase construction between the support member mounting surface and the web member. The thermal resistance increase of the composite heat sink apparatus attendant with the physical insertion of an electrically-insulative pedestal in very significant, at least about 0.5 degree centigrade/watt, which in turn correspondingly increases power transistor junction temperatures by at least 1 degree centigrade to upwards of 75 degrees centigrade.

In commercial practice both the heat-conductive elongate bar and the mounting hardware for separably securing the electronic component and the pedestal insulator to the elongate bar are electrically conductive. In the usual situation wherein two metallic mounting bolts pass through aligned perforations in the electronic component, the pedestal insulator, and the electrically conductive elongate bar, it is necessary to insulate both bolts and their holding nuts from the elongate bar. This does entail the cumbersome assembly procedure of inserting two electrically insulative separable sleeve-like bushings into the elongate bar perforation while simultaneously positioning the pedestal insulator. In prevalent commercial practice wherein mica washers are employed as the pedestal insulator, the messy soft amorphous filler substance is applied between the washer and the irregular elongate bar so as to promote heat conductive contact between the two.

It is accordingly the general object of the present invention to facilitate the electrically insulative attachment of an electronic component to the electrically conductive uni-phase elongate bar support member of a heat sink.

It is a specific object of the present invention to eliminate the need for applying a messy soft amorphous filler substance between the pedestal insulator and elongate bar.

It is another specific object to eliminate the need for using separable electrically insulative sleeve-like bushings between electrically conductive mounting bolts and the heat sink electrically conductive elongate bar.

It is yet another specific object to eliminate the need for a separable pedestal insulator.

These and the other objects and advantages are attained by providing as the pedestal insulator a thermally stable resinous material that is adherent directly onto both elongate surfaces of a multi-perforate electrically conductive elongate bar and to the perforation side walls so as to provide a unitary dual-phase heat sink support member. Even though the dielectric constants for most resinous materials are less than that for most refractory materials e.g. mica, surprisingly, resinous pedestal insulators are desirably operable for those applications wherein voltages under 750 are to be encountered, provided the resinous material is thermally stable and non-melting at 100 degrees centigrade temperatures.

Figure 1:
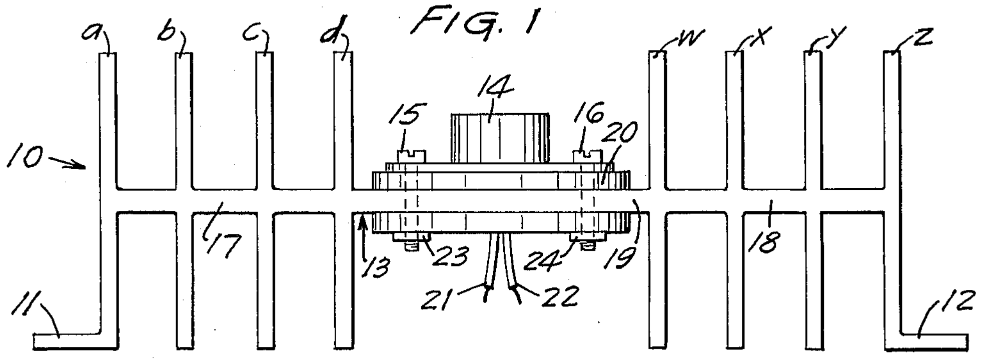
FIGURE 1 illustrates in side elevation a heat dissipator apparatus in accordance with the present invention, a transistor being mounted upon the unitary dual-phase support member thereof.
Figure 2:
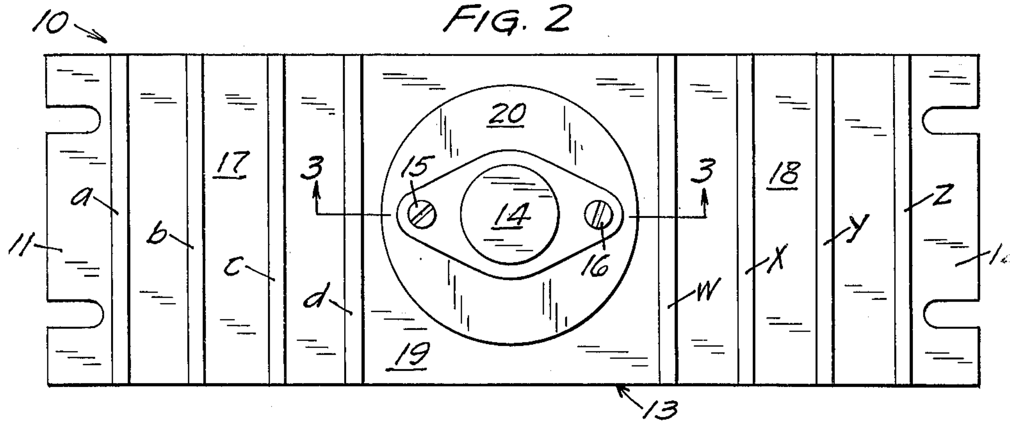
FIGURE 2 is a top plan view of the heat dissipator apparatus of FIGURE 1.
Figure 3:
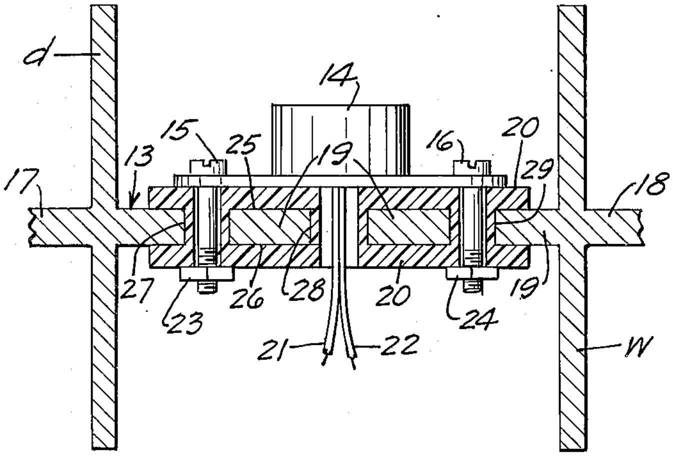
FIGURE 3 illustrates, in transverse section 3—3 of FIGURE 1, the heat dissipator apparatus at the position of the transistor.

The heat dissipator apparatus 10 as illustrated in FIGURES 1–3 comprises two banks of parallel thin heat dissipators ribs *a*, *b*, *c*, *d*, *w*, *x*, *y*, and *z*, ribs *a* and *z* being provided with notched mounting flanges 11 and 12. The plurality of ribs are rigidly spaced along two heat conductive planar web members 17 and 18. Between ribs *d* and *w*, and in heat conductive relationship therewith, is unitary dual-phase support member 13 comprising an electrically insulative resinous pedestal 20 adherent to a multi-perforate heat conductive uni-phase elongate bar 19. The elongate bar 19 is of the uni-phase variety since it is in uni-phase relationship with web members 17 and 18. Resinous pedistal 20 is adherent to top mounting surface 25 and bottom surface 26 of elongate bar 19 as well as to the side walls of perforations 27, 28 and 29. Against the planar surface of pedestal member 20 is attached the transistor unit 14 by means of securely positioned threaded bolts 15 and 16 together with holding nuts 23 and 24, said bolts passing through the transistor case, through and below perforations 27 and 29. Transistor leads 21 and 22 pass through the support member 13; if leads 21 and 22 are electrically insulated, it is unnecessary that pedestal 20 cover side walls of perforation 28.

The following illustrative, though non-limiting, resinous substances provide suitable insulative pedestals for the multi-perforate uni-phase elongate bar of a heat dissipator apparatus, including the extruded unitary heat sink shown in the drawing. So as not to create too great an impediment to heat transfer, it is desirable that the insulative pedestal create a physical separation no more than thirty mils thick between the electronic component and the multi-perforate uni-phase elongate bar; for this purpose, resinous materials having a dielectric constant greater than 2.5 at one million cycles are preferred.

*Heat curable silicone resins*

A particularly interesting variety is available under the trade name "Dow Corning 991 Varnish." As thus obtained from the Dow Corning Corporation, the product is a 50% resin solution in xylene solvent. It dries at room temperature in five hours to a tack-free, water repellent, straw-colored residue that is essentially 100% silicone resin. The silicone resin residue is characterized by its ability to cure to a markedly toughened state at temperatures exceeding 20 degrees centigrade.

The "Dow Corning 991 Varnish" is diluted with sufficient xylene to provide a homogeneous 10% solids varnish. A heat sink multi-perforate elongate bar, including the perforation side walls, is cleansed with xylene solvent and dried so as to remove any dirt, oil and grime. The 10% solids varnish is thinly painted onto both surfaces of the multi-perforate elongate bar and upon the side walls of the intersecting perforations so as to provide a dried resinous coating less than two mils thick. After the coating has been dried at room temperature for about fifteen minutes at atmospheric pressure so as to become, to the touch, tack-free, a second coating is similarly applied and dried. Alternatively, the varnish can be applied with an air brush. Then, the coated heat sink is transferred to an oven heated to 220 degrees centigrade for a period of one hour to heat cure the three mil thick resinous insulator pedestal. The heat cured resinous insulator pedestal does not melt or tackify at 100 degrees centigrade; the dielectric constants at one million cycles is about 2.7.

*Moldable phenolic resins*

A particularly interesting phenolic resin is available under the trade name "RX–600" from the Rogers Corporation, Rogers, Connecticut. As thus obtained, it is a 100% solids block, 12 mesh phenolic resin powder. It is applied onto the two elongate surfaces and the perforation side walls of the multi-perforate uni-phase elongate bar at a thickness of five mils utilizing a heat and pressure injection molding technique. The mold includes pins inserted into the perforations. The preferred application technique entails injecting the powder into the mold heated to a temperature of 160 degrees centigrade at a pressure of 4,000 pounds per square inch. Upon cooling, the mold is removed. The phenolic resin pedestal does not melt or tackify at 100 degrees centigrade. The dielectric constant at one million cycles is about 4.5.

*Fluidized epoxy resins*

An especially desirable fluidized epoxy resin is available under the trade name "XR-5060" from the Minnesota Mining and Manufacturing Company, as thus obtained, it is free-flowing powder, each particle being a homogeneous mixture of the epoxy resin and a curing agent therefor. Upon fusion of the particle at 175 degrees centigrade, the curing agent reacts with the epoxy so as to cross-link the epoxy to a subsequently less infusible state.

The heat sink apparatus is heated to 175 degrees centigrade. The fluidized epoxy resin powder is sprayed onto the two elongate surfaces and the perforation side walls of the multi-perforate uni-phase elongate bar so as to just cover the designated surfaces. The powder momentarily melts, cross-links, and then automatically re-solidifies adherently to the designated surfaces so as to provide a resinous insulator pedestal. The epoxy resin pedestal does not melt or tackify at 100 degrees centigrade. The dielectric constant at one million cycles exceeds 2.6.

I claim:

A heat dissipator apparatus for a transistor comprising:

(A) A plurality of heat dissipator ribs spaced along a web member in continuous phase structural continuity with said ribs, (B) A unitary dual-phase support member comprising a multi-perforate thin elongate bar in structural uniphase continuity with said web member, the top and bottom surfaces of the elongate bar together with the sidewalls of at least two perforations thereof having an adherent hard structurally-continuous resinous coating that does not melt or tackify at temperatures up to and including 100 degrees centigrade, said resinous coating having a dielectric constant exceeding 2.5 at one million cycles, and (C) A transistor attached against the resinous coating of the elongate bar top surface by means of a plurality of securely positioned threaded bolts passing through the transistor case and extending through and below those elongate bar perforations having resinously coated sidewalls.

References Cited by the Examiner

UNITED STATES PATENTS

| | | | |
|---|---|---|---|
| 2,817,048 | 12/1957 | Thuermel et al. | 317—234 |
| 2,964,688 | 12/1960 | McAdam | 317—234 |
| 2,984,774 | 5/1961 | Race | 317—234 |
| 3,165,672 | 1/1965 | Gellert | 317—100 |

ROBERT A. O'LEARY, *Primary Examiner.*

A. W. DAVIS, *Assistant Examiner.*